United States Patent
Kanari (10) Patent No.: US 7,310,011 B2
(45) Date of Patent: Dec. 18, 2007

(54) CLOCK SIGNAL ADJUSTER CIRCUIT

(75) Inventor: Katsunao Kanari, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/071,316

(22) Filed: Mar. 4, 2005

(65) Prior Publication Data

US 2006/0139078 A1   Jun. 29, 2006

(30) Foreign Application Priority Data

Dec. 27, 2004   (JP)   ............... 2004-377925

(51) Int. Cl.
*G06F 1/04*   (2006.01)
(52) U.S. Cl. ............... 327/295; 327/292; 327/293
(58) Field of Classification Search ............... 327/149, 327/156–158, 243–245, 291–297; 365/233, 365/194
See application file for complete search history.

(56) References Cited

U.S. PATENT DOCUMENTS

| | | | |
|---|---|---|---|
| 5,670,903 A * | 9/1997 | Mizuno | ............... 327/158 |
| 5,815,540 A * | 9/1998 | Aoki | ............... 375/376 |
| 5,969,551 A | 10/1999 | Fujioka | |
| 6,088,255 A | 7/2000 | Matsuzaki et al. | |
| 6,271,696 B1 | 8/2001 | Kobayashi | |
| 6,437,650 B1 * | 8/2002 | Sung et al. | ............... 331/25 |
| 6,538,957 B2 * | 3/2003 | Magoshi | ............... 365/233 |
| 6,653,877 B2 | 11/2003 | Tsujino | |
| 6,861,883 B2 * | 3/2005 | Hirota et al. | ............... 327/149 |
| 7,042,269 B2 * | 5/2006 | Kao | ............... 327/295 |
| 7,102,406 B2 * | 9/2006 | Ishihara | ............... 327/200 |

FOREIGN PATENT DOCUMENTS

| | | |
|---|---|---|
| JP | 56-122520 | 9/1981 |
| JP | 64-017515 | 1/1989 |
| JP | 8-190443 | 7/1996 |
| JP | 10-336008 | 12/1998 |
| JP | 11-273342 | 10/1999 |
| JP | 2000-183730 | 6/2000 |
| JP | 2002-15569 | 1/2002 |
| JP | 2002-094374 | 3/2002 |

* cited by examiner

*Primary Examiner*—Dinh T. Le
(74) *Attorney, Agent, or Firm*—Staas & Halsey LLP (57) ABSTRACT

The present invention relates to a clock signal distribution circuit for distributing the clock signal to circuits such as LSI integrated circuits, and, more specifically, provides a clock adjuster circuit, which performs phase difference adjustment of clock signals automatically. It is a circuit, which on driving a circuit element implemented on an LSI chip, supplies the clock signal, which is a reference for driving, is distributed subsequently from first distribution to lower-level distributions of a hierarchical structure, or from a fifth level distribution circuit "5" to every area on the LSI chip, for example. At that time, delay of the clock signal is detected by a phase difference detector circuit, the delay data is automatically written to a delay adjuster circuit built into each of the fifth level distribution circuits "5". Using the delay data, the phase difference of the clock signals, is adjusted when the LSI chip is manufactured.

7 Claims, 7 Drawing Sheets

CLOCK SIGNAL ADJUSTER CIRCUIT

BACKGROUND OF THE INVENTION

1. Field of the Invention

The present invention relates to a clock signal regulator circuit, which adjusts the phase of a clock signal provided to an integrated circuit such as an LSI integrated circuit.

2. Description of the Prior Art

Many electronic circuits of the present day contain LSI integrated circuits. To use such integrated circuits, a clock signal is required in order to synchronize and to operate each element of the circuit. In an actual circuit, in order to secure driving power[adg1], the clock signal is provided to each unit of the integrated circuit through several stages[adg2] of the driver. Many drivers are, therefore, used in the integrated circuit however, phase difference (clock skew) of the clock signal is caused by production tolerances in drivers, wiring and by other side effects. More specifically, the causes of the phase difference of the clock signal are variations in the transistors constituting the drivers, variation in width and thickness of the wiring pattern, variation in temperature of the integrated circuit and variation in voltage.

In the conventional method of LSI production, in order to prevent errors caused by phase differences, the phase difference is estimated and a structure is prepared to calculate the phase difference, by multiplying a preset variation coefficient by the phase of the reference clock.

The following Patent Documents 1 through 6 describe inventions relating to the phase adjustment of the clock signal. For example, Patent Document 1 (Japanese unexamined patent publication bulletin No. 2000-183730) describes a clock distribution system, which distributes the clock signal. The system comprises a phase comparison circuit, which compares the phases of the delayed clock signal with an external reference clock signal, counts based on the comparison result in the phase comparison circuit, and sets the delay time based on the count value.

Patent Document 2 (Japanese unexamined patent publication bulletin No. 11-273342) discloses an invention relating to a semiconducting memory device comprising a clock phase regulator circuit. The time period required until lock-on [adg3], is reduced by regulating the delay time immediately after power-on operation or immediately after coming out of standby mode.

Patent Document 3 (Japanese unexamined patent publication bulletin No. 10-336008) describes an invention, comprising a first DLL circuit, which outputs a roughly-adjusted clock by regulating the delay time of the received clock in stages, and a second DLL circuit for each of a plurality of entities, which outputs a plurality of clocks by regulating the delay time of the roughly-adjusted clock in stages. By comprising these two circuits, the phase of the clock signal is adjusted by the invention.

Patent Document 4 (Japanese unexamined patent publication bulletin No. 2002-94374) is with regard to an invention, comprising three S-R flip-flops, each consisting two AND gates, a NAND gate and an inverter. The maximum operating frequency is higher than the existing device so that the up-signal and the down-signal can be output according to the phase difference of both signals even if the phase difference between the reference clock signal and the clock signal is large.

Patent Document 5 (Japanese unexamined patent publication bulletin No. 08-190443) describes an invention, which enables sufficient reduction of skew when a group of logic circuits distributing the clock signal are not arranged uniformly in the clock distribution circuit.

In addition, Patent Document 6 (Japanese unexamined patent publication bulletin No. 2002-15569) describes an invention providing a semiconductor device which equalizes the delay time of the clock signal provided to a plurality of synchronous circuits. The device of the invention improves the synchronization by performing adjustments for each internal circuit even though the difference in the clock signal delay time is caused by the clock wiring.

However, in recent years, the situation is that because the clock frequency used in integrated circuits, such as LSI integrated circuits, has become very high and the corresponding time interval of a cycle extremely short, the slightest phase difference cannot be ignored. In addition, as integrated circuits continue to be miniaturized and as the degree of integration improves, the number of drivers and latches built into an LSI integrated circuit increases, and therefore, better control of the phase difference is now an imperative.

An approach is proposed where the phase difference (clock skew) is measured externally to the integrated circuit during production, and based on the measurement result, adjustment data is written to the driver. However, there is no proposal to realize automatic phase adjustment in the LSI integrated circuit.

SUMMARY OF THE INVENTION

The present invention is intended to address the above problems, and provides a clocks signal adjuster circuit, which contrives to miniaturize the integrated circuit, to improve the degree of integration, to detect and adjust the phase difference of the clock signal in response to the clock frequency improvement, to maintain a small phase difference, to offer a technical advantage, and to improve the production yield.

According to the present invention, the above problems can be solved by providing a clock signal adjuster circuit, comprising first distribution means for distributing a reference clock signal to an integrated circuit, a plurality of second distribution means for receiving the clock signal distributed from the first distribution means and distributing the signal to each area of the integrated circuit, phase difference detector means for detecting phase differences between the phase of the reference clock signal distributed from the first distribution means and the phase of the clock signal distributed from one of the second distribution means, and phase difference adjustment means for adjusting the phase of the clock signal based on the phase difference detected by the phase difference detector means.

For example, in an integrated circuit such as an LSI IC, the reference clock signal is, first, provided through the first distribution means to a plurality of the second distribution means, which provides the clock signal to each area of the integrated circuit. At that time, the delay, between the clock signals, is detected by the phase difference detection means, and the delay adjustment means automatically adjusts the phases of the clock signals output from the second distribution means based on the detection result.

The data, containing the delay time set in the delay adjustment means, itself becomes adjustment data integrated into the LSI IC, and the second distribution means, which automatically includes the adjustment result, is configured based on this delay time.

Based on the adjustment result of the phase difference adjustment means, the phase difference adjustment of another second distribution means is performed, and subsequently, the phase difference adjustment of the clock signal between all the second distribution means is achieved automatically.

The phase difference detector means uses a phase difference detector circuit, comprising two clock input terminals, carrying out phase inverting processing on one of the clock signals provided to the two input terminals, providing the clock signals to a consistency detector circuit, providing an RA latch circuit to the output of the consistency detector circuit, and detecting the phase difference of the clock signals.

In addition, the phase difference adjuster circuit comprises a count circuit counting the output signal from the phase difference detection means, and a clock signal delay circuit, which delays the clock signal based on the count data counted by the count circuit.

With such a configuration, the phase difference detector circuit and the phase difference adjuster circuit can be integrated into specific circuits, and the phase difference of the clock signals provided to each area of the integrated circuit can be adjusted automatically.

The present invention is characterized by a phase difference detector circuit, comprising two clock input terminals, carrying out phase inverting processing on one of the clock signals provided to the two input terminals, providing the clock signals to a consistency [adg4] detector circuit, providing an RA latch circuit with the output of the consistency/inconsistency detector circuit, and detecting the phase difference [adg5] of the clock signals.

Such a configuration is simpler than that of the circuits in the above Patent Documents, and thus the number of transistors can be reduced.

DESCRIPTION OF THE PREFERRED EMBODIMENT

First Embodiment[adg6]

In the following description, details of the preferred embodiment of the present invention are set forth with reference to drawings.

Figure 2:
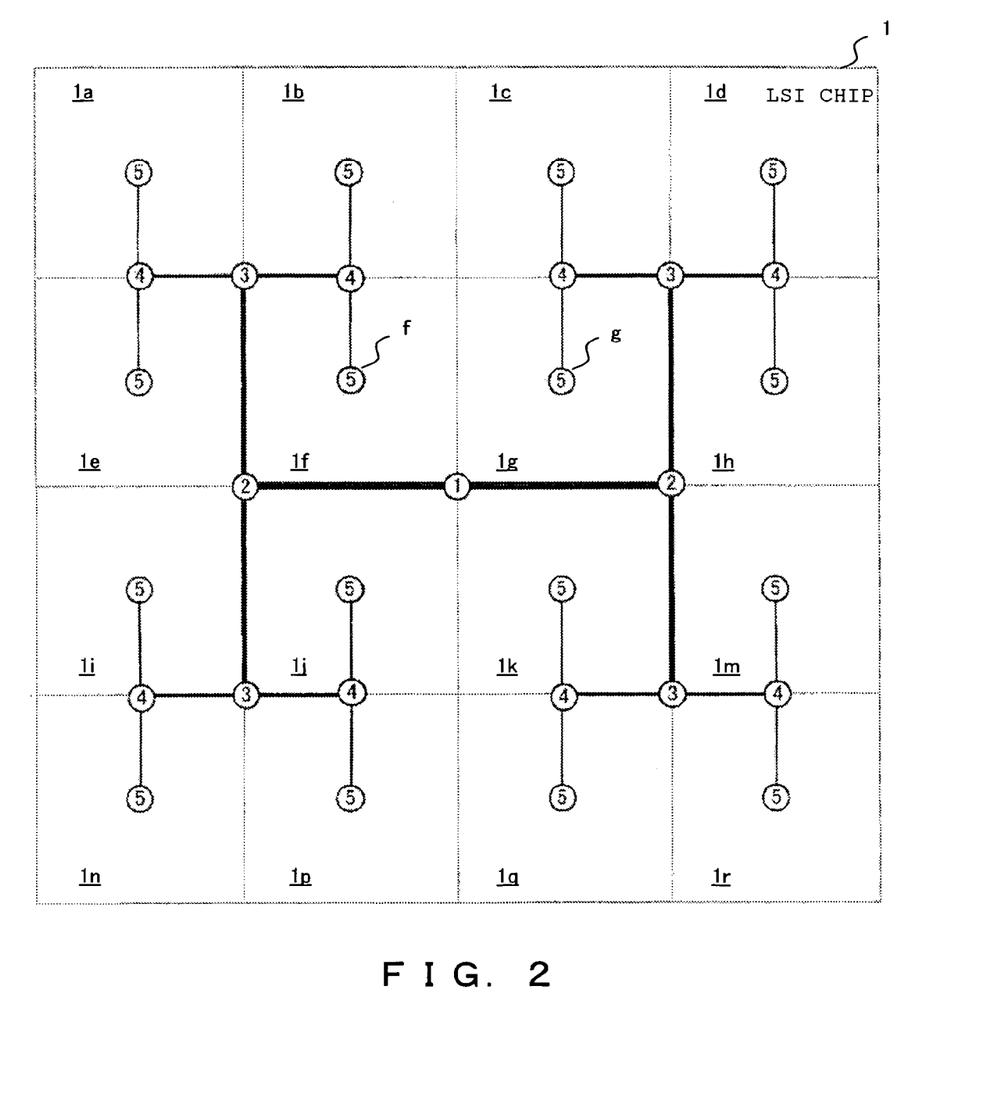
FIG. 2 shows an example of the clock distribution of an LSI IC with a five-tiered H-shaped hierarchical structure.

FIG. 2 is a pattern diagram of the clock adjustment circuit explaining the illustrated embodiment, which also shows an example of the clock signal distribution.

Figure 1:
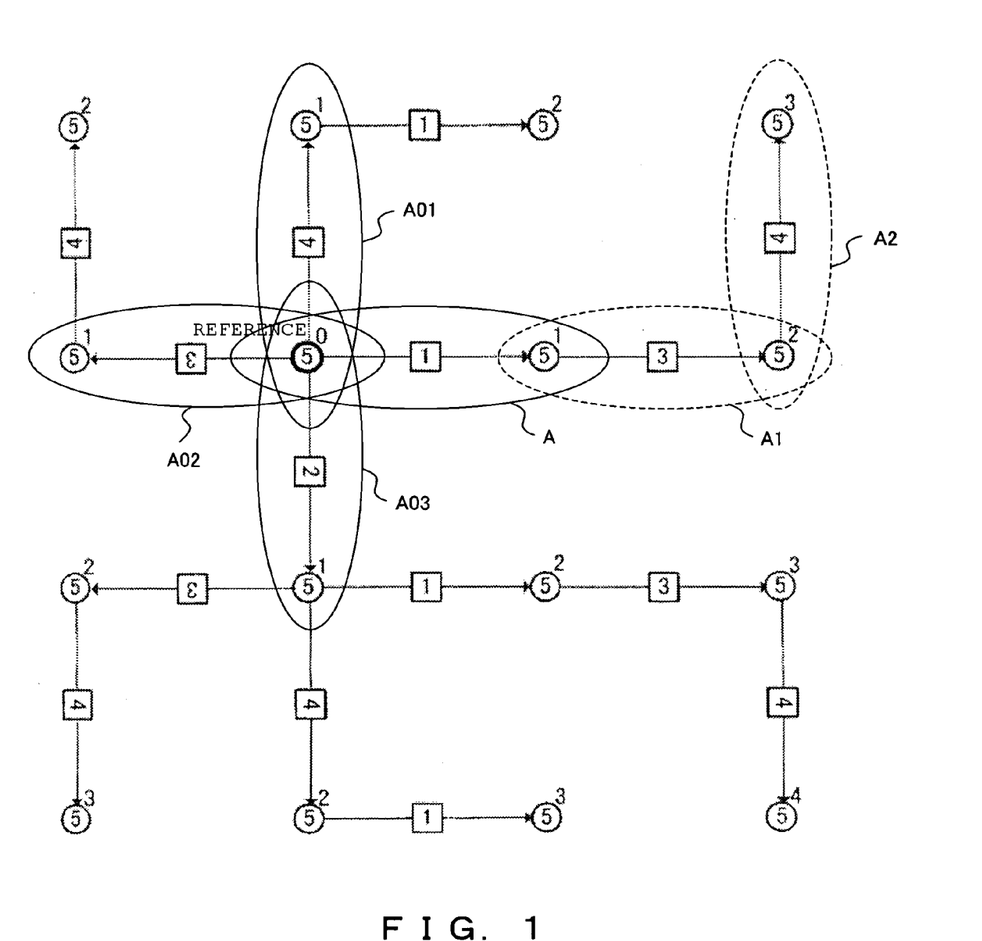
FIG. 1 is a pattern diagram of the clock adjustment circuit explaining the illustrated embodiment.

In FIG. 1, the LSI chip 1 has wiring for the distribution of the clock signal. The encircled numerals in FIG. 1 indicate the order of clock signal distribution. For example, a circled "1" indicates that the first distribution circuit distributes the reference clock signal, circled "2" indicates the next or second distribution circuit, circled "3" is the third distribution circuit, circled "4" is the fourth distribution circuit and circled "5" is the fifth distribution circuit.

Accordingly, each area 1*a*~1*r* of FIG. 2 of the LSI chip 1 has a clock signal provided by the fifth distribution circuit configured in the corresponding area. In the illustrated embodiment, the hierarchy of the clock signal distributors is five levels deep. However, the distribution depth can be increased or reduced, depending on the size of the circuit configured in the LSI chip 1 and the number of elements.

The clock signal distribution of the present invention has an H-shaped hierarchical structure (H-tree system), and the reference clock signal is sequentially distributed in the order of the circled numerals, namely the first distribution circuit, the second distribution circuit, the third distribution circuit, the fourth distribution circuit, and finally the fifth distribution circuit. For that reason, a driver is included[adg7] in each distributor circuit, and the driver provides the latched clock signal to a distributor unit in the next stage. Each of the encircled distributor units with its circled number has an associated phase adjuster circuit.

FIG. 1 is a pattern diagram showing an example of a circuit detecting the phase difference of the delayed signal by the clock signal distribution and adjusting the clock signal delay according to the phase difference. The example shown in FIG. 1 is an example carrying out the adjustment in the lowest hierarchy (the fifth distribution circuit), which is most likely to generate a phase difference.

In FIG. 1, first, the reference fifth distribution circuit "5"$^0$ is the fifth distribution circuit f located in the area 1*f* of FIG. 2, and the fifth distribution circuit "5"$^1$ to its right side is the fifth distribution circuit g located in the area 1*g* of FIG. 2. The numeral of the superscript on each distributor unit shown in FIG. 1 indicates the number of phase detector circuits passed through from the reference.

The circuits indicated by numerals within a square, in FIG. 1, are the phase detector circuits, and the number in the square is the distribution number of the driver with the highest hierarchy level common to the distribution circuits either side of the square (in this case the fifth distribution circuits) whose phases are to be adjusted. Specifically, for the fifth distribution circuits mentioned above ("5"$^0$ and the rightmost "5"$^1$) the shared driver is the first distribution driver, and the fifth distribution circuit of ("5"$^1$ and "5"$^2$) physically located to the right of "5"$^0$ the shared driver is the third distribution driver. That is, the smaller the number in the square is, the farther away the common clock signal source is located by following connecting wires[adg8]. The phase adjustment of a part indicated by an arrow is carried out with reference to the clock phase of the driver at the tail of the arrow (shown inside a square). With respect to distribution circuits with an even number distance (i.e. superscript that is an even number) from the reference at the tail of the arrow, the phase is adjusted in ascending order (i.e. in the direction from the reference to the terminal distribution circuit). Distribution circuits with an odd number distance (i.e. superscript that is an odd number) from the reference at the tail of the arrow, the phase is adjusted in descending order (i.e. in the direction from the terminal distribution circuit to the reference).

Figure 3:
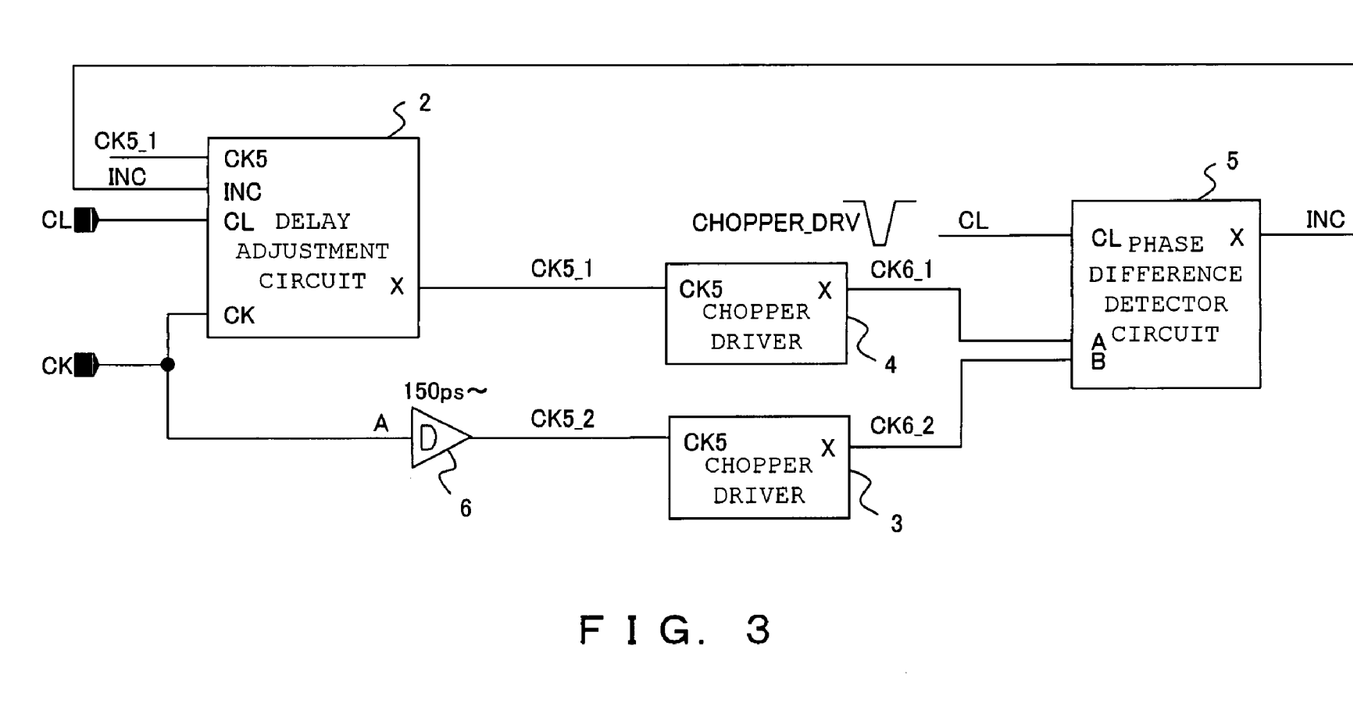
FIG. 3 is a circuit diagram showing a part of FIG. 1.

A magnified view of the region "A" shown in FIG. 2 is provided in FIG. 3. This circuit comprises a delay adjuster circuit 2, a chopper driver 3 of the fifth distribution circuit "5"$^0$, a chopper driver 4 of the fifth distribution circuit "5"$^1$, a phase difference detector circuit 5 and delay circuit 6. To the delay adjuster circuit 2, an increment signal (hereinafter referred to as INC signal) is provided from the phase difference detector circuit 5. The delay adjuster circuit 2 counts the INC signal input, delays the output of the clock signal provided for the delay time according to the count result, and outputs the signal to the chopper driver 4. The delay circuit 6 is a signal delay circuit, which delays the reference clock signal by the preset delay time, and the reference clock signal delayed by the delay circuit 6 is provided to the chopper driver 3. The phase difference detector circuit 5 detects the phase difference between both signals, and provides the INC signal to the delay adjuster circuit 2 while the phase difference exists.

In the following description, details of the configuration of each circuit are provided.

Figure 4:
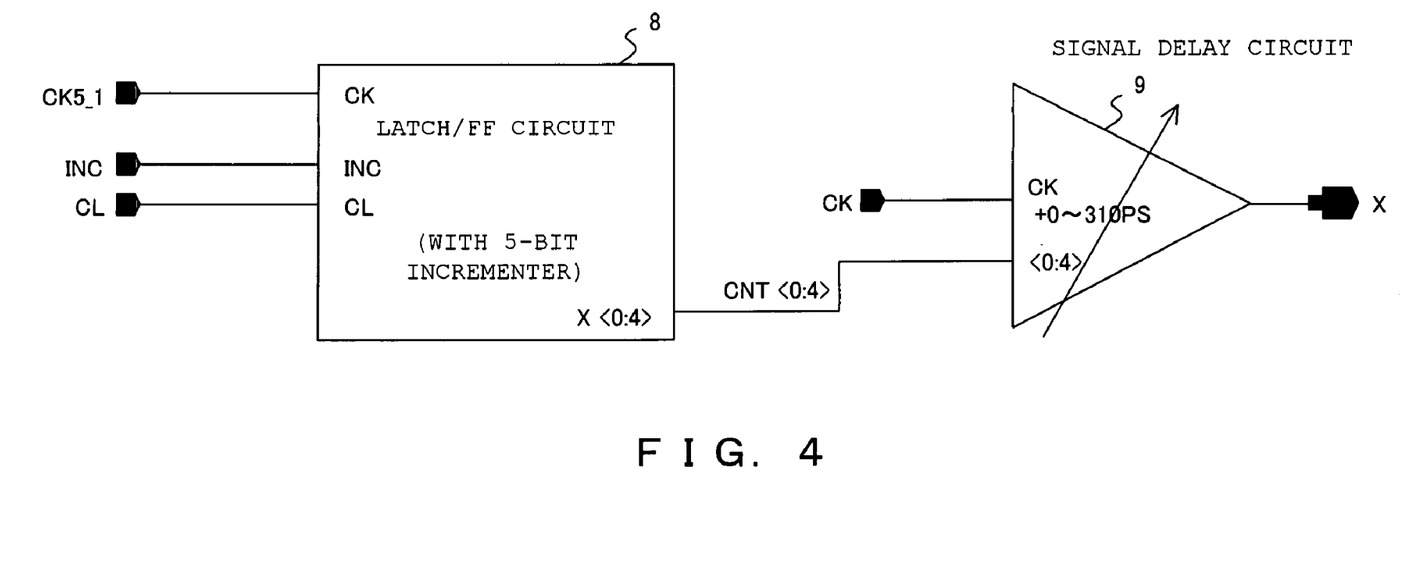
FIG. 4 describes the details of the delay adjustment circuit.

FIG. 4 is the circuit configuration of the delay adjuster circuit 2, comprising a latch/FF circuit 8 and the INC signal delay circuit 9. The delay adjuster circuit 2 adjusts the phase of a clock signal CK5_1 based on the INC signal output from the phase difference detector circuit 5. For that reason, the INC signal, the clock signal CK5_1, and the reset signal (CL) are input to the latch/FF circuit 8.

The latch/FF circuit 8 used in the illustrated embodiment is a circuit with a 5-bit incrementer, incrementing the INC signal output from the phase difference detector circuit 5 in order and outputting the INC signal to the signal delay circuit 9 as 5-bit count data (CNT<0:4>). The signal delay circuit 9 is a circuit, which delays signals based on the provided count data. It delays the clock signal CK5_1 in time based on the count data, and outputs the delayed signal to the chopper driver. For example, in the signal delay circuit 9, where the delay can be adjusted from 0 to 310 ps, the clock signal CK5_1 is delayed by 10 ps when the 5-bit count data is "00001", by 30 ps when the count data is "00011", by 70 ps when the count data is "00111", by 150 ps when the count data is "01111", and by 310 ps when the count data is "11111".

The clock signal CK5_1 delayed by the above processing is output by the chopper driver 4 to the phase difference detector circuit 5 as the clock signal CK6_1. The preset time of the delay circuit 6 explained above and the signal, which is delayed relative to[adg9] the reference clock signal (the clock signal CK6_2) are provided to chopper driver 3. The preset delay time is a certain time period set at, for example, more than 150 ps, which is the estimated maximum value of the phase variation, in the illustrated embodiment.

Figure 5:
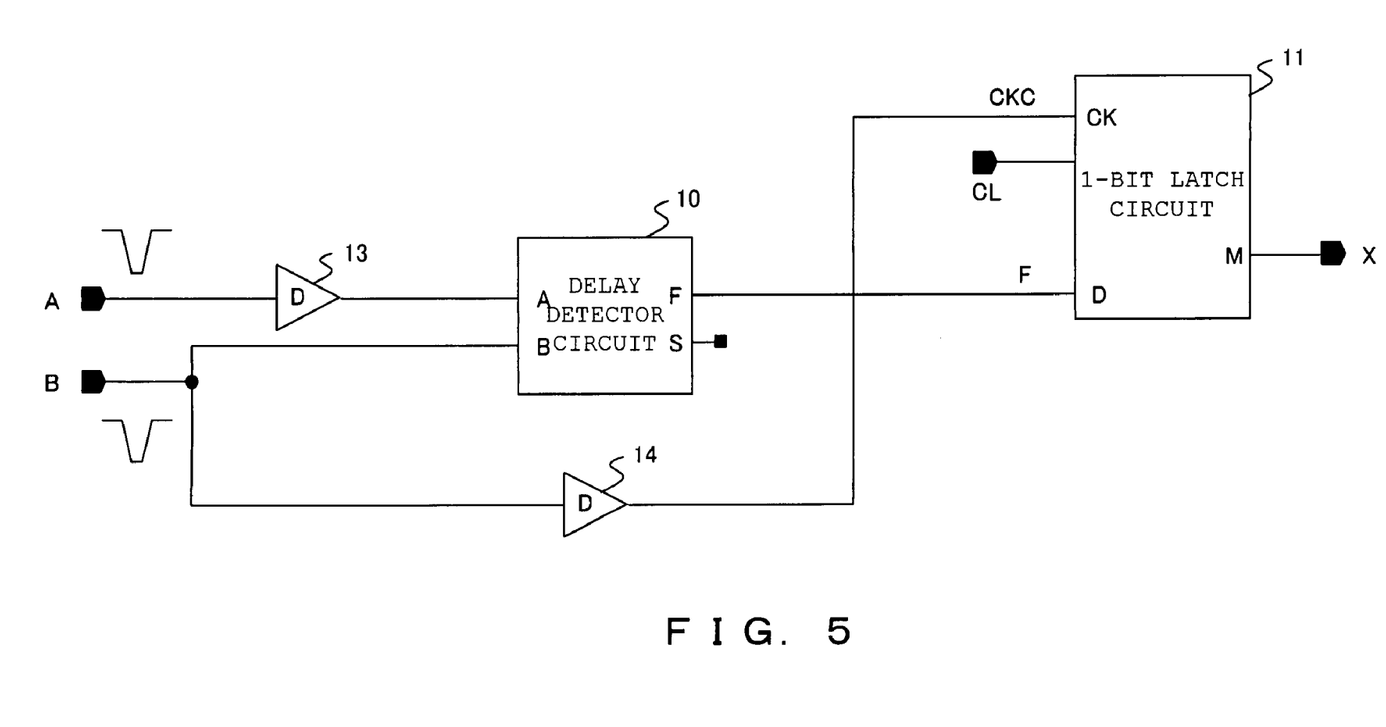
FIG. 5 describes the details of the phase difference detector circuit.

The clock signals CK6_1 and CK6_2 are provided to the phase difference detector circuit 5. FIG. 5 is a definite example of the phase difference detector circuit 5, comprising a delay detector circuit 10, a latch circuit 11, and delay circuits 13 and 14. The delay detector circuit 10 is a circuit detecting the presence or absence of a signal delay (phase difference) between the clock signals CK6_1 and CK6_2, and the detection signal is output to the latch circuit 11.

After the detection signal is provided to the D terminal of the latch circuit 11, the detection signal is latched by the latch circuit 11 according to the timing signal input to a CK terminal. The INC signal is output from the latch circuit 11 (phase difference detector circuit 5) to the delay adjuster circuit 2. The delay circuit 13 is a buffer, and the delay circuit 14 is a circuit for generating a clock signal slower than both the clock signals CK6_1 and CK6_2. This generated signal is used as the timing signal.

Figure 6:
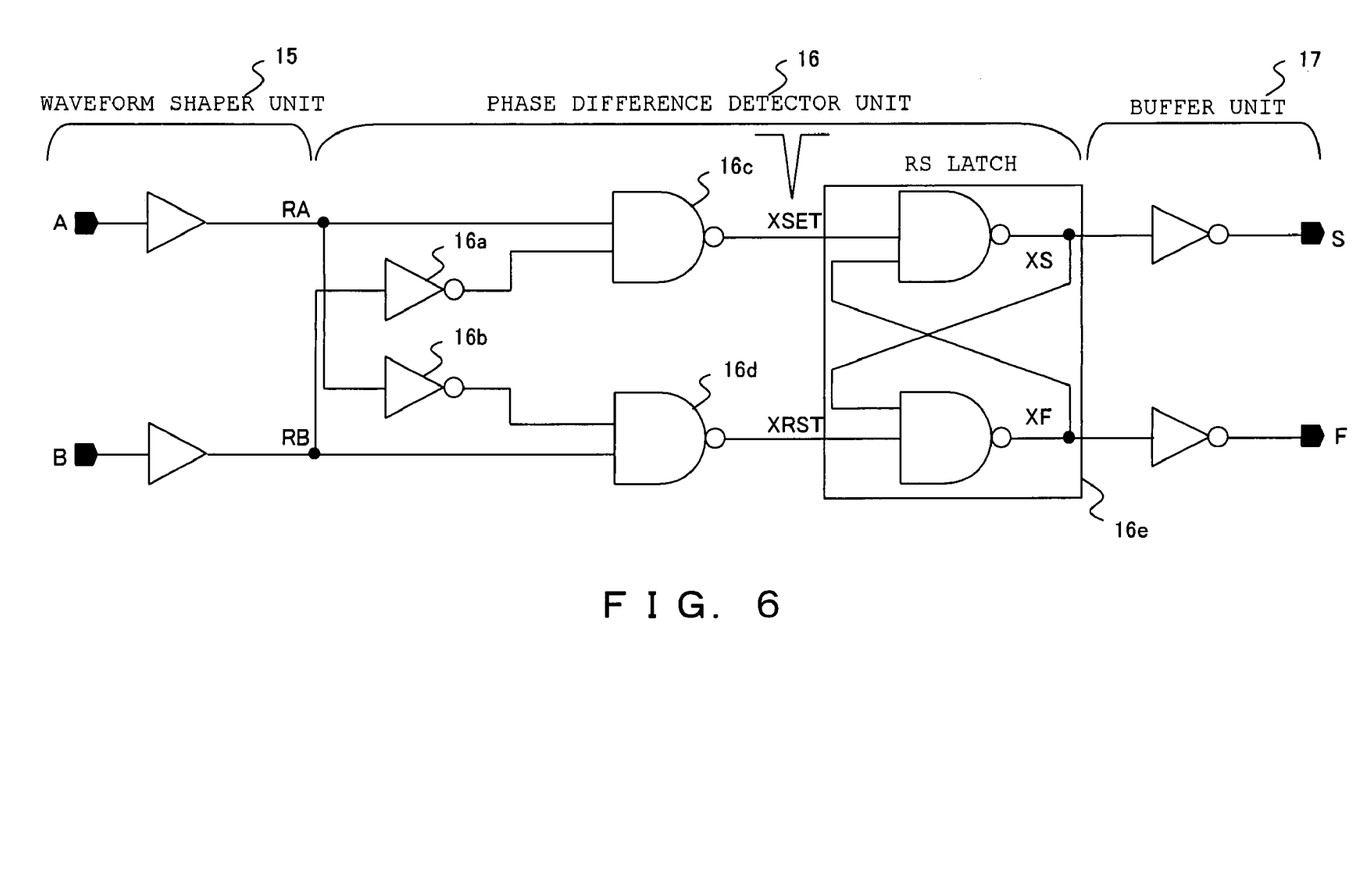
FIG. 6 describes the details of the delay detector circuit.

FIG. 6 shows a definite example of the delay detector circuit 10. The delay detector circuit 10 comprises a waveform shaper unit 15, a phase difference detector 16, and buffer unit 17. The waveform shaper unit 15 shapes the waveform of the clock signals CK6_1 and CK6_2 output from the chopper drivers 3 and 4, and provides the clocks signal to the phase difference detector unit 16. The phase difference detector 16, comprising phase inverters 16a and 16b, NAND gates 16c and 16d, and an RS latch circuit 16e, detects the presence or the absence of a phase difference between the clock signals CK6_1 and CK6_2 provided by the waveform shaper unit 16.

Figure 7:
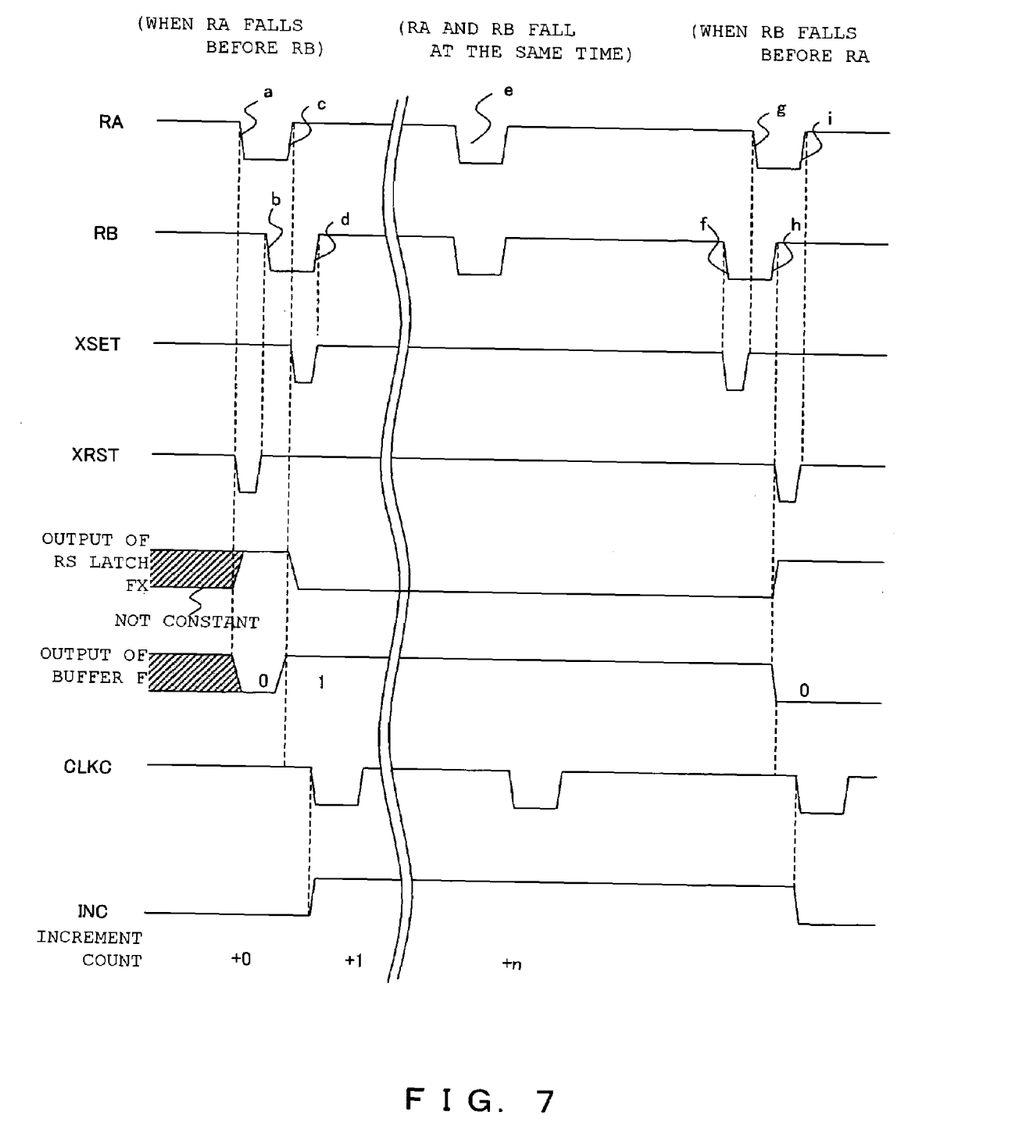
FIG. 7 is a timing chart explaining the illustrated embodiment.

The circuit operation of the illustrated embodiment is explained using the timing chart of FIG. 7. In FIG. 7, the signal represented by RA is the clock signal CK6_1 provided to the phase difference detector unit 16 via the waveform shaper 15. The signal represented by RB is the clock signal CK6_2 provided to the phase difference detector unit 16 via the waveform shaper unit 15.

Just before the signal RA (the clock signal CK6_1) is input, the outputs of the signals RA and RB are both in the high level (hereinafter referred to as the H level), as in FIG. 7, and the outputs from the NAND gates 16c and 16d (XSET and XRST) are also in H the level. The output of the RS latch circuit 16e (XF) is not constant.

When the signal RA (the clock signal CK6_1) is input at the timing "a" in FIG. 7, a high signal (hereinafter referred to as an H signal) is provided to the NAND gate 16d through the phase inverters 16b, and the output (XRST) of the NAND gate 16d changes to the low level (hereinafter referred to as the L level). The output (XF) of the RS latch circuit 16e, therefore, changes to the H level ("1"). At the same time, one input of the NAND gate 16c changes to the L level, however the output (XSET) of the NAND gate 16c is fixed at the H level.

When the signal RB is input at the timing "a" in FIG. 7, one input of the NAND gate 16d changes to the L level, and the output (XRST) of the NAND gate 16d returns to the H level. The output (XF) of the RS latch circuit 16e, then, maintains the H level ("1") as shown in FIG. 7. In such a case, the H signal is provided to the input of the NAND gate 16c, while the output (XSET) of the NAND gate 16c maintains the H level.

When the signal RA returns to the H level at the timing "c" in FIG. 7, both inputs to the NAND gate 16c are in the H level, the output (XSET) of the NAND gate 16c changes to the L level. For that reason, the output (XF) of the RS latch circuit 16e is changed to the L level ("0").

When the signal RA returns to the H level at the timing "d" in FIG. 7, the L signal is input to the NAND gate 16c through the phase inverter 16a, and changes the output (XSET) of the NAND gate 16c to the H level, while the output (XF) of the RS latch circuit 16e maintains the L level ("0").

The output (XF) of the RS latch circuit is output to the latch circuit 11 as the detection signal (F) through the inverter of the buffer unit 17. Later, when the timing signal (CLKC) is input to the latch circuit 11, the INC signal synchronized with the timing signal is output from the latch circuit 11 to the delay adjuster circuit 2. In other words, the INC signal is output from the phase difference detector circuit 5 shown in FIG. 3 to the delay adjuster circuit 2.

The INC signal provided after the above processing is incremented (+1) in the delay adjuster circuit 2 (the latch/FF circuit 8), and sent to the signal delay circuit 9 as count data <0:4>. The signal delay circuit 9 performs delay processing of the signal according to the count data, and outputs the outcome to the chopper driver 4 in the same way as described above. By the above processing, the clock signal CK6_1, output from the chopper driver 4, shows a slight delay in output timing (10 ps delay, for example).

By repeating the above processing, the processing explained in FIG. 7 is repeated, and the output timing of the clock signal CK6_1 shows a gradually increasing delay (of 10 ps increments, for example) with increasing count. The outputs of both signals correspond to each other at the timing "e" in FIG. 7. At that time, the outputs (XSET and XRST) cannot be obtained from the NAND gates 16c and 16d, and the output (XF) of the RS latch circuit 16e maintains the L level.

At the next timing ("f" in FIG. 7), the signal RB falls first, making the output (XSET) of the NAND gate 16c assume the L level. At the timing "g" in FIG. 7, the signal RA falls next, bringing the output (XSET) back to the H level. Additionally, at the timing "h" in FIG. 7, the signal RB rises first, making the output (XRST) of the NAND gate 16d assume the L level. At the timing "i" in FIG. 7, the signal RA also rises, bringing the signal (XRST) back to the H level.

By the above sequence of events, the output (XF) of the RS latch circuit 16e is changed from the L level ("0") to the H level ("1"), and maintained at the H level ("1") afterward. Therefore, the INC signal is not provided from the phase difference detector circuit 5 to the delay adjuster circuit 2, and the signal delay of the signal delay circuit 9 is fixed.

Subsequently, the clock signal CK5_1 is provided to the chopper driver 4 based on the delay data stored in the signal delay circuit 9 (delay adjuster circuit 2), and the clock signal CK6_1 is provided to the area 1g of the LSI chip 1 through the chopper driver 4.

The above processing is a method, in which the phase of the clock signal CK5_1 is delayed in such a way that the phases of all areas [adg10] correspond to each other. The method matches the phases by gradually advancing the phase. In such a case, the latch/FF circuit should be a circuit carrying out count down, the output timing of the clock signal is adjusted by the phase difference detector circuit 5 sequentially providing decrement signals.

With respect to phase adjustment processing, the explanation of the region "A", in FIG. 1, is provided above. The same phase adjustment processing is carried out on the fifth distribution circuits "5"[1] and "5"[2] shown in a region "A1", of FIG. 1, and also to the fifth distribution circuits "5"[3] and "5"[4] shown in a region "A2", of FIG. 1. During the phase difference adjustment of the region "A", phase adjustment is also performed simultaneously in regions, including a driver with a superscript of 1 such as region "A01" above region "A", region "A02" to the left and region "A03" below. Subsequently, automatic adjustment is performed in the order of the superscript numbers.

According to the illustrated embodiment, the delay adjuster circuit 2 and the phase difference detector circuit 5 are built into the LSI chip 1 along with the driver circuits. The LSI chip 1 realizes adjustment of phase difference of the clock signal automatically provided to each area within a short time period after power-on, and storage of the adjustment data in the delay adjustment circuit 2. The LSI chip 1 itself can be shipped as a product.

The phase difference in the clock signal provided to each area of the LSI chip 1 can be corrected automatically, improving product yield. The clock signal phases can be adjusted in a state of low voltage supply, using a high clock frequency, consequently the LSI chip 1 offers a technical advantage in LSI and reduction of power consumption.

It is not required that the adjustment areas in the chip are connected in any specific order, and in no matter what order they are connected, the adjustment areas would retain the property that their phases can be adjusted to be constant. [adg11] Considering the characteristic that the phase difference increases with increasing distance between the source and the distribution, the phases of the distributions located away from the source should be adjusted first, and then the phases of the distributions closer to the source should be adjusted. By so doing, the phase difference across the [adg12] whole LSI chip can be reduced.

Furthermore, considering that the variation in phase is unevenly arranged over the chip, arrangement of the adjuster circuits so as to alternate the phase-advancing and phase-delaying adjustments prevents a situation arising where the phase difference is always the same direction.

According to the present invention, phase difference (clock skew), on providing the clock signal to the integrated circuit, can be automatically adjusted inside the integrated circuit, in the delay adjustment circuit 2. The LSI chip 1 itself can be shipped as a product, with the adjustment data stored. Thus, the product yield can be improved.

The clock signal phases can be adjusted in a state of low voltage supply, using a high clock frequency, consequently the LSI chip 1 offers a technical advantage in LSI and a reduction of power consumption.

What is claimed is:

1. A clock signal adjuster circuit, comprising:
 a first distribution circuit distributing a reference clock signal as a first distributed clock signal to an integrated circuit;
 an n-th distribution circuit finally distributing a n-th distributed clock signal, which is sequentially distributed via a second distribution circuit to an (n−1)-th distribution circuit which are configured hierarchically between the first distribution circuit and the n-th distribution circuit, to each area of the integrated circuit;
 a delay circuit delaying the reference clock signal as a delayed reference clock signal for a designated time period;
 a phase difference detector circuit detecting a phase difference between phases of the delayed reference clock signal and the n-th distributed clock signal distributed to said each area; and
 a phase difference adjustment circuit adjusting the phase of the n-th distributed clock signal distributed to said each area based on the phase difference detected by the phase difference detector circuit, wherein said phase difference adjustment circuit adjusts the phase of the n-th distributed clock signal at a location of the n-th distribution circuit.

2. The clock signal adjuster circuit according to claim 1, wherein the difference between phases of the delayed reference clock signal and the n-th distributed clock signal distributed to said each area is detected, based on an adjustment result by the phase difference adjustment circuit.

3. The clock signal adjuster circuit according to claim 1, wherein the phase difference adjustment circuit stores the detected phase difference between phases of the delayed reference clock signal and the n-th distributed clock signal distributed to said each area as an adjusted signal delay data, and is built into the integrated circuit as a phase difference adjustment circuit.

4. The clock signal adjustment circuit according to claim 1, wherein the phase difference adjustment circuit comprises:
 a count circuit counting an output signal from the phase difference detection circuit; and
 a clock signal delay circuit, which delays the (n−1)-th delayed clock signal as the n-th delayed clock signal based on a count data counted by the count circuit.

5. A clock signal adjusting method, comprising:
 distributing a reference clock signal as a first distributed clock signal to an integrated circuit;

finally distributing an n-th distributed clock signal, which is sequentially distributed based on a hierarch via a second distribution to a (n−1)-th distribution between a first distribution and an n-th distribution, to each area of the integrated circuit;

delaying the reference clock signal as a delayed reference clock signal for a designated time period;

detecting a phase difference between phases of the delayed reference clock signal and the n-th distributed clock signal distributed to said each area; and adjusting the phase of the n-th distributed clock signal distributed to said each area based on the detected phase difference at a location of the n-th distribution circuit.

6. A clock signal adjuster circuit, comprising:

a first distribution circuit for distributing a reference clock signal as a first distributed clock signal to an each area of an integrated circuit;

with the reference clock signal sequentially distributed from the first distribution circuit to the n-th distribution circuit as an n-th distributed clock signal;

a delay circuit delaying the reference clock signal as a delayed reference clock signal for a designated time period;

a phase difference detector circuit for detecting a phase difference between phases of the delayed reference clock signal and the n-th distributed clock signal distributed to said each area; and a phase difference adjustment circuit for adjusting the phase of the n-th distributed clock signal based on the phase difference detected by the phase difference detector circuit, wherein the first distribution circuit to the n-th distribution circuit are respectively the first distribution circuit and the n-th distribution circuit in a series of distribution circuits numbered 1,2, . . . (n−1), n, . . . (n=1), the first distribution circuit through the n-th distribution circuit are configured hierarchically, and the phase difference adjustment circuit adjusts the phase of the n-th distributed clock signal at a location of the n-th distribution circuit.

7. A clock signal adjuster circuit, comprising:

a first distribution circuit distributing a clock signal as a first distributed clock signal to an integrated circuit;

an n-th distribution circuit receiving the first distributed clock signal which is sequentially distributed via a second distribution circuit to an (n−1)-th distribution circuit which is configured hierarchically between the first distribution circuit and the n-th distribution circuit;

a phase difference detector circuit detecting a phase difference between phases of the delayed reference clock signal and the n-th distributed clock signal distributed from predetermined n-th distribution circuits;

a delay circuit delaying the reference clock signal as a delayed reference clock signal for designated time period; and a phase difference adjustment circuit adjusts the phase of the the n-th distributed clock signal at a location of the predetermined n-th distribution circuits based on the phase difference detected by the phase difference detector circuit.

* * * * *

UNITED STATES PATENT AND TRADEMARK OFFICE
CERTIFICATE OF CORRECTION

| | |
|---|---|
| PATENT NO. | : 7,310,011 B2 |
| APPLICATION NO. | : 11/071316 |
| DATED | : December 18, 2007 |
| INVENTOR(S) | : Katsunao Kanari |

It is certified that error appears in the above-identified patent and that said Letters Patent is hereby corrected as shown below:

Column 8, Line 25, after "distributing" delete "a" and insert --an--.

Column 9, Line 2, change "hierarch" to --hierarchy--.

Column 9, Line 3, after "to" change "a" to --an--.

Column 9, Line 17, after "to" delete "an".

Column 9, Line 18, change "circuit;" to --circuit--.

Column 10, Line 5, change "(n=1)," to --(n+1),--.

Column 10, Line 27, after "the" delete "the". (Second Occurrence)

Signed and Sealed this

Seventeenth Day of June, 2008

JON W. DUDAS
*Director of the United States Patent and Trademark Office*